US006499127B1

(12) United States Patent
Kim et al.

(10) Patent No.: US 6,499,127 B1
(45) Date of Patent: Dec. 24, 2002

(54) METHOD AND APPARATUS FOR RANDOM STIMULUS GENERATION

(75) Inventors: Won Sub Kim, Fremont, CA (US); Mary Lynn Meyer, Mountain View, CA (US); Daniel Marcos Chapiro, Palo Alto, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 09/298,986

(22) Filed: Apr. 22, 1999

(51) Int. Cl.[7] ........................... G01R 31/28; G06F 11/00
(52) U.S. Cl. ......................... 714/739; 714/728
(58) Field of Search ........................... 714/724, 727, 714/728, 738, 739

(56) References Cited

U.S. PATENT DOCUMENTS

| | | | |
|---|---|---|---|
| 4,070,565 A | 1/1978 | Borrelli | |
| 4,937,827 A | 6/1990 | Beck et al. | |
| 5,202,889 A | 4/1993 | Aharon et al. | |
| 5,469,367 A | 11/1995 | Puri et al. | |
| 5,513,122 A | 4/1996 | Cheng et al. | |

(List continued on next page.)

OTHER PUBLICATIONS

Mark R. Headington and David D. Riley, "Data Abstraction and Structures Using C++", D. C. Heath and Company, 1994.*

(List continued on next page.)

*Primary Examiner*—Albert Decady
*Assistant Examiner*—Joseph D. Torres
(74) *Attorney, Agent, or Firm*—Jonathan T. Kaplan; Howrey Simon Arnold & White, LLP

(57) ABSTRACT

The present invention adds capabilities to a Hardware Verification Language (HVL) which facilitate the generation of random test data. Sources of random numbers are easily produced by simply adding a randomness attribute to a variable declaration of a class definition. Such variables are called random variables. A "randomize" method call may be made to an instance of the class definition to produce random values for each random variable. The values assigned to random variables are controlled using constraint blocks, which are part of the class definition. A constraint block is comprised of constraint expressions, where each constraint expression limits the values that can be assigned to a random variable on the left-hand-side (lhs) of the constraint expression. A constraint_expression can constrain any random variable which has been declared at its level in the class hierarchy, or at any higher level. A constraint_expression cannot constrain a random variable declared at a lower level in the hierarchy. If a constraint block of an instance is active or ON, then all the constraint expressions in the block will act to constrain their lhs random variable. A constraint block which is OFF means that all of its constraint expressions will not act to constrain their random variables. The method "constraint_mode" can be used to turn ON or OFF any constraint blocks of an instance. The effects of a constraint block can be completely eliminated by defining, at a lower level in the hierarchy, another constraint block with the same name.

10 Claims, 8 Drawing Sheets

Microfiche Appendix Included
(5 Microfiche, 442 Pages)

U.S. PATENT DOCUMENTS

| | | | |
|---|---|---|---|
| 5,530,370 A | | 6/1996 | Langhof et al. |
| 5,530,841 A | | 6/1996 | Gregory et al. |
| 5,548,525 A | | 8/1996 | Albee et al. |
| 5,594,741 A | | 1/1997 | Kinzelman et al. |
| 5,649,164 A | | 7/1997 | Childs et al. |
| 5,684,808 A | | 11/1997 | Valind |
| 5,784,377 A | | 7/1998 | Baydar et al. |
| 5,841,967 A | | 11/1998 | Sample et al. |
| 5,870,590 A | | 2/1999 | Kita et al. |
| 5,905,883 A | | 5/1999 | Kasuya |
| 5,907,494 A | * | 5/1999 | Dangelo et al. ............... 703/1 |
| 5,920,490 A | | 7/1999 | Peters |
| 6,006,028 A | * | 12/1999 | Aharon et al. ................ 703/21 |
| 6,035,109 A | | 3/2000 | Ashar et al. |
| 6,044,211 A | * | 3/2000 | Jain ............................ 716/18 |
| 6,076,083 A | | 6/2000 | Baker |
| 6,077,304 A | | 6/2000 | Kasuya |
| 6,081,864 A | | 6/2000 | Lowe et al. |
| 6,110,218 A | * | 8/2000 | Jennings ..................... 703/22 |
| 6,141,630 A | | 10/2000 | McNamara et al. |
| 6,167,363 A | * | 12/2000 | Stapleton ..................... 703/14 |
| 6,182,258 B1 | | 1/2001 | Hollander |
| 6,192,504 B1 | * | 2/2001 | Pfluger et al. ................ 716/1 |
| 6,212,625 B1 | | 4/2001 | Russell |
| 6,219,809 B1 | | 4/2001 | Noy |

OTHER PUBLICATIONS

Gary York, Robert Mueller–Thuns, Jagat Patel and Derek Beatty, "An Integrated Environment for HDL Verification", IEEE 1995.*

A. J. van der Hoeven, P. van Prooijen, E. F. Deprettere and P.M. Dewilde, "A Hardware Design System based on Object–Oriented Principles", IEEE, 1991.*

IBM TDB ("Behvavioral Fault Simulation", IBM Technical Disclosure Bulletin, vol. 28, No. 4, Sep. 1, 1985, pp. 1577–1578 (1–3).

Yang et. al. ("Scheduling and control generation with environmental constraints based on automata representations", IEEE Transactions on Computer–Aided Design of Integrated Circuits and Systems, vol. 15, No. 2, Feb. 1996, pp. 166–183).

Cabodi et al. ("Extending equivalence class computation to large FSMs", 1995 IEEE International Conference on Computer Design: VLSI in Computers and Processors, Oct. 2, 1995, pp. 258–263).

Hsiao et al. ("Fast static compaction algorithms for sequential circuit test vectors", IEEE Transactions on Computers, vol. 48, No. 3, Mar. 1999, pp. 311–322).

Pomeranz et al. ("ACTIV–LOCSTEP: a test generation procedure based on logic simulation and fault activation", Twenty–Seventh Annual International Symposium on Fault–Tolerant Computing, 1997, FTCS-27, Digest of Papers, Jun. 24, 1997, pp. 144–151).

U.S. patent application Ser. No. 60/048,755, Hollander et al., filed Jun. 1997.

* cited by examiner

Class Definition:

class <class name> [ extends <parent class> ]
{
<variable declarations>

<constraint blocks>

<methods>
}

FIG. 1

Random Variable Declaration:

rand <variable specification>;

randc <variable specification>;

FIG. 2

Associative Array Declaration:

<rand or randc>
<data type of array's elements>
<array name>[ ] assoc_size
<expression for # of elements to be randomized>
;

FIG. 3

Generation Methods:

<instance>.randomize()

<instance>.rand_mode(
    <ON/OFF> [ , <variable specification> ] )

<instance>.rand_mode(
    <REPORT> , <variable specification> )

FIG. 4

Constraint Block Definition:

constraint <constraint block name>
{
<constraint_expressions>
}

FIG. 5

Constraint Expression:

<lhs random variable> <relational operator> <rhs expression>;

FIG. 6

Constraint Methods:

<instance>.constraint_mode(
    <ON/OFF> [ , <constraint block specification> ] )

<instance>.constraint_mode(
    REPORT , <constraint block name> )

FIG. 7

HLevel_record Contents:

DAG /* pointer to DAG, only used for top-level HLevel_record */

<data storage for each variable declared by Vera language programmer, including handles to each instance of another user-defined class instantiated as a variable by Vera language programmer>

<rand_flag for each random variable declared by Vera language programmer>

<rtable for each non-array randc random variable declared by Vera language programmer>

<rtable for each element of regular randc array declared by Vera language programmer>

<rand_assoc_array flag to indicate each associative randc array declared by Vera language programmer> num_rvars /* The number of random variables in HLevel_record */ ptr_to_all_rvar_ptrs /* Points to an array of pointers. Each pointer points to a random variable of HLevel_record */

<hidden_var for each constraint block> constraint_block_list

FIG. 9

Constraint_block Contents:

cons_block_name hidden_var_ptr /* Points to hidden_var in HLevel_record for this constraint_block */ num_constraints /* number of constraints in this constraint_block */ cons_table_ptr /* Points to array of one_constraint records for this constraint_block */

FIG. 10

One_constraint Contents:

lhs /* Pointer to random variable for lhs of this one_constraint. Random variable may be in HLevel_record directly associated with one_constraint, or in an ancestor HLevel_record. */ relop num_rhs_vars /* Number of random variables on rhs of this one_constraint */ rhs_vars /* Pointer to an array of pointers. Each points to a location in an HLevel_record for a random variable on the rhs of this one_constraint. The HLevel_record may be one with which one_constraint is directly associated, or in any ancestor. */ start_addr /* Start address for execution of Vera assembly code which evaluates rhs of one_constraint */

FIG. 11

Associative Array Constraint_block Contents:

cons_block_name = "assoc_size"

hidden_var_ptr = NULL /* Since always ON */ num_constraints = <number of associative arrays in this HLevel_record> cons_table_ptr = <pointer to an array with one one_constraint record for each associative array in this HLevel_record>

FIG. 12

Associative Array One_Constraint Contents:

lhs = <pointer to the data storage region of the appropriate HLevel_record for maintaining the entire associative array> relop = "ASSOC_SIZE"

num_rhs_vars = <number of random variables in expression which determines number of elements to be randomized> rhs_vars = <pointer to an array of pointers, where each pointer in array points to a random variable in the expression which determines the number of elements to be randomized> start_addr = <start address for Vera assembly code which determines the number of elements to be randomized>

FIG. 13

DAG Node Contents:

rvar_pointer /* points to random variable in an HLevel_record which this DAG node represents */ do_randomize /* indicates that random variable, represented by the DAG node, should be assigned a random value */ relop_start_addr_list /* pointer to list of relop/start_addr pairs for each constraint_expression which the random variable, represented by the DAG node, appears on the lhs of */ set_constraint_field /* calculated from relop/start_addr pairs; expresses all the valid ranges from which the random variable, represented by the DAG node, can be assigned a randomly chosen value */ depends_on_list /* pointer to linked list of pointers which point to the DAG nodes this node's random variable depends on */ ordering_number /* the higher this number is, the more random variables depend on it. used by linearize_dag to order DAG nodes */ next_dag_node /* pointer to later DAG node in linear ordering */ previous_dag_node /* pointer to earlier DAG node in linear ordering */

FIG. 14

Set Constraint Contents:

Array of ranges, where each each range is a tuple containing:

low_end /* low end of range */ high_end /* high end of range */ apportion_op /* apportionment operator */ weight /* weight applied by apportionment operator */ sub_ranges /* Pointer to linked list of sub_ranges this range may be split into */ num_values /* number of valid values represented by this range */

FIG. 15

METHOD AND APPARATUS FOR RANDOM STIMULUS GENERATION

CROSS REFERENCE TO RELATED APPLICATIONS

This application is related to the following co-pending U.S. patent applications, all of which were filed on the same day as the present application and all of which are herein incorporated by reference: "Method and Apparatus For Random Stimulus Generation," filed with inventors Won Sub Kim, Mary Lynn Meyer and Daniel Marcos Chapiro, having McDermott, Will & Emery and U.S. Patent Office Ser. No. 09/298,984; and "Method and Apparatus For Random Stimulus Generation," filed with inventors Won Sub Kim, Mary Lynn Meyer and Daniel Marcos Chapiro, having McDermott, Will & Emery and U.S. Patent Office Ser. No. 09/298,981.

This application is related to the following co-pending U.S. patent application, all of which is herein incorporated by reference: "Method and Apparatus For Determining Expected Values During Circuit Design Verification," filed on Mar. 31, 1999, with inventors Won Sub Kim, Valeria Maria Bertacco, Daniel Marcos Chapiro and Sandro Pintz, having McDermott, Will & Emery and U.S. Patent Office Ser. No. 09/283,774.

MICROFICHE APPENDIX

This patent includes a Microfiche Appendix which consists of a total of 5 microfiche that contain a total of 442 frames.

FIELD OF THE INVENTION

The present invention relates generally to the generation of random test data, and more particularly to the generation of such test data as part of a verification programming language.

BACKGROUND OF THE INVENTION

Random test data has a wide variety of uses. A particularly important application of random test data is in the verification of digital electronic circuits in order to exercise a wide variety of circuit paths for possible faults.

To tackle the increasing complexity of integrated digital electronic circuits, designers need faster and more accurate methods for verifying the functionality and timing of such circuits, particularly in light of the need for ever-shrinking product development times.

The complexity of designing such circuits is often handled by expressing the design in a high-level hardware description language (HLHDL). The HLHDL description is then converted into an actual circuit through a process, well known to those of ordinary skill in the art as "synthesis," involving translation and optimization. Typical examples of an HLHDL are IEEE Standard 1076-1993 VHDL and IEEE Standard 1364-1995 Verilog HDL, both of which are herein incorporated by reference.

An HLHDL description can be verified by simulating the HLHDL description itself, without translating the HLHDL to a lower-level description. This simulation is subjected to certain test data and the simulation's responses are recorded or analyzed.

Verification of the HLHDL description is important since detecting a circuit problem early prevents the expenditure of valuable designer time on achieving an efficient circuit implementation for a design which, at a higher level, will not achieve its intended purpose. In addition, simulation of the design under test (DUT) can be accomplished much more quickly in an HLHDL than after the DUT has been translated into a lower-level, more circuit oriented, description.

The verification of HLHDL descriptions has been aided through the development of Hardware Verification Languages (or HVLs). Among other goals, HVLs are intended to provide programming constructs and capabilities which are more closely matched to the task of modeling the environment of an HLHDL design than are, for example, the HLHDL itself or software-oriented programming languages (such as C or C++). HVLs permit a DUT, particularly those DUTs expressed in an HLHDL, to be tested by stimulating certain inputs of the DUT and monitoring the resulting states of the DUT.

SUMMARY OF THE INVENTION

The present invention adds to Vera capabilities which facilitate the generation of random test data.

In an analogy to classical signal-processing models, Vera provides a "source" of data (random number generation) and the facilities for designing a series of "filters" (constraints) to transform that data into a form which provides adequate testing.

Sources of random numbers are easily produced by simply adding the randomness attribute "rand" or "randc" to a variable declaration of a class definition. Such variables with a randomness attribute are referred to as "random variables."

Adding a randomness attribute to a variable declaration permits a class instance containing the variable to make meaningful use of the "randomize" method for the generation of random values for those declared variables. A randomize method call causes any random variables of an instance to have a randomly generated value (or values) assigned.

The randomness attribute can be applied to user-defined sub-objects of an instance, as well as to built-in data types. The randomness attribute can be applied to arrays of fixed size or to "associative arrays" of undeclared size.

The values assigned to random variables are controlled using "constraint blocks," which are part of the class definition. A constraint block is comprised of constraint_expressions, where each constraint_expression limits the values which can be assigned to a random variable which is on the left-hand-side (lhs) of the constraint_expression. The right-hand-side (rhs) of a constraint_expression, in conjunction with a relational operator, is used to derive a range or ranges of permissible values for the lhs random variable.

The introduction of constraint blocks in a class definition permits instances of that class to make meaningful use of the "constraint_mode" method. Initially, all constraint blocks of an instance are active or ON, meaning that all the constraint_expressions within the block will act to constrain their lhs random variables, constraint_mode can be used to turn ON or OFF any or all constraint blocks of an instance. A constraint block which is OFF means that all of its constraint_expressions will not act to constrain their lhs random variables.

A constraint_expression can constrain any random variable which has been declared at its level in the class hierarchy, or at any higher level. A constraint_expression cannot constrain a random variable declared at a lower level in the hierarchy. Lower level classes inherit variables and methods from higher level classes.

A single random variable can be constrained by zero or more constraint_expressions, each of which may be in a different constraint block and at a different class hierarchy level. A single random variable may not be constrained by constraint_expressions, however, which present logically inconsistent constraints. Such logical inconsistencies are checked for while performing the randomize method since such "inconsistencies" may dynamically appear, and disappear, under program control. For example, inconsistencies may appear and disappear depending upon which constraint blocks have been enabled with the constraint_mode method. Other possibilities, for controlling the existence of inconsistencies, are values assigned to other random variables during the execution of randomize method, as well as the values assigned to non-random variables before randomize is begun.

Because random variables may appear on the rhs of a constraint_expression, the following complications are handled. A constraint_expression with rhs random variables means that the lhs random variable of the expression "depends on" the rhs random variables for the value which may be chosen. Therefore, there is an implicit ordering in which values must be assigned to random variables: the rhs random variables must be assigned their random values first such that the constraints, which limit the permissible values for the lhs random variable, can be determined. This ordering may continue through several constraint_expressions, since the rhs random variables of one constraint_expression may themselves be lhs random variables of other constraint_expressions which also have random variables on their rhs.

The dependency, of one random variable upon the prior assignment of other random variables, is expressed by means of a directed acyclic graph (or DAG). It is syntactically possible to define a cyclic dependency between random variables—such cyclic dependencies are detected during DAG construction and are not permitted.

In order to perform the randomize method, a linear ordering must be derived from the DAG or DAGs which may be constructed. The linear ordering is derived such that each random variable is not assigned a value until all random variables which it depends upon (directly or indirectly) for constraining its permissible values have already been assigned values.

The randomize method operates by evaluating the constraint_expressions which are ON according to the linear ordering. For a particular lhs random variable, call it random variable X, its constraint_expressions are translated into a set_constraint structure which we shall call Y.

The set_constraint structure Y consists of tuples, called ranges, which specify the valid values which the random variable X can assume. These ranges also have weights associated with them which indicate the relative probability with which a value for X should be selected from that range. The selection of a random value for X, from its set_constraint Y, is basically a two-step process. First, a range within set_constraint Y is randomly chosen, where the likelihood of choosing a particular range is increased by its weight value. Secondly, within the range selected a particular value is randomly selected.

Advantages of the invention will be set forth, in part, in the description that follows and, in part, will be understood by those skilled in the art from the description or may be learned by practice of the invention. The advantages of the invention will be realized and attained by means of the elements and combinations particularly pointed out in the appended claims and equivalents.

BRIEF DESCRIPTION OF THE DRAWINGS

The accompanying drawings, that are incorporated in and constitute a part of this specification, illustrate several embodiments of the invention and, together with the description, serve to explain the principles of the invention:

FIG. 1 shows the general syntactic structure of a class definition, in accordance with the present invention;

FIG. 2 depicts the general syntactic structure for declaring random variables, in accordance with the present invention;

FIG. 3 illustrates the general syntactic structure for declaring an associative array, in accordance with the present invention;

FIG. 4 shows methods which are used in conjunction with random variables;

FIG. 5 depicts the general syntactic structure for declaring a constraint block as part of a class definition;

FIG. 6 shows the general syntactic structure for declaring a constraint_expression as part of a constraint block declaration;

FIG. 7 shows methods which are used in conjunction with constraint blocks;

FIG. 9 illustrates the general structure of a record for representing a single level of the class hierarchy for an instance;

FIG. 10 illustrates the general structure of a record for representing a constraint block within a hierarchical class instance;

FIG. 11 depicts the general structure of a record for representing a constraint_expression within record for representing a constraint block;

FIG. 12 depicts the general structure of a record for representing a constraint block, as applied to the particular situation of representing associative arrays;

FIG. 13 depicts the general structure of a record for representing a constraint_expression, as applied to the particular situation of representing an associative array;

FIG. 14 shows the general structure representing a DAG node;

FIG. 15 shows the general structure of a set_constraint structure for representing the valid potential values for a random variable.

BRIEF DESCRIPTION OF PRINTED APPENDICES

Figure 8:
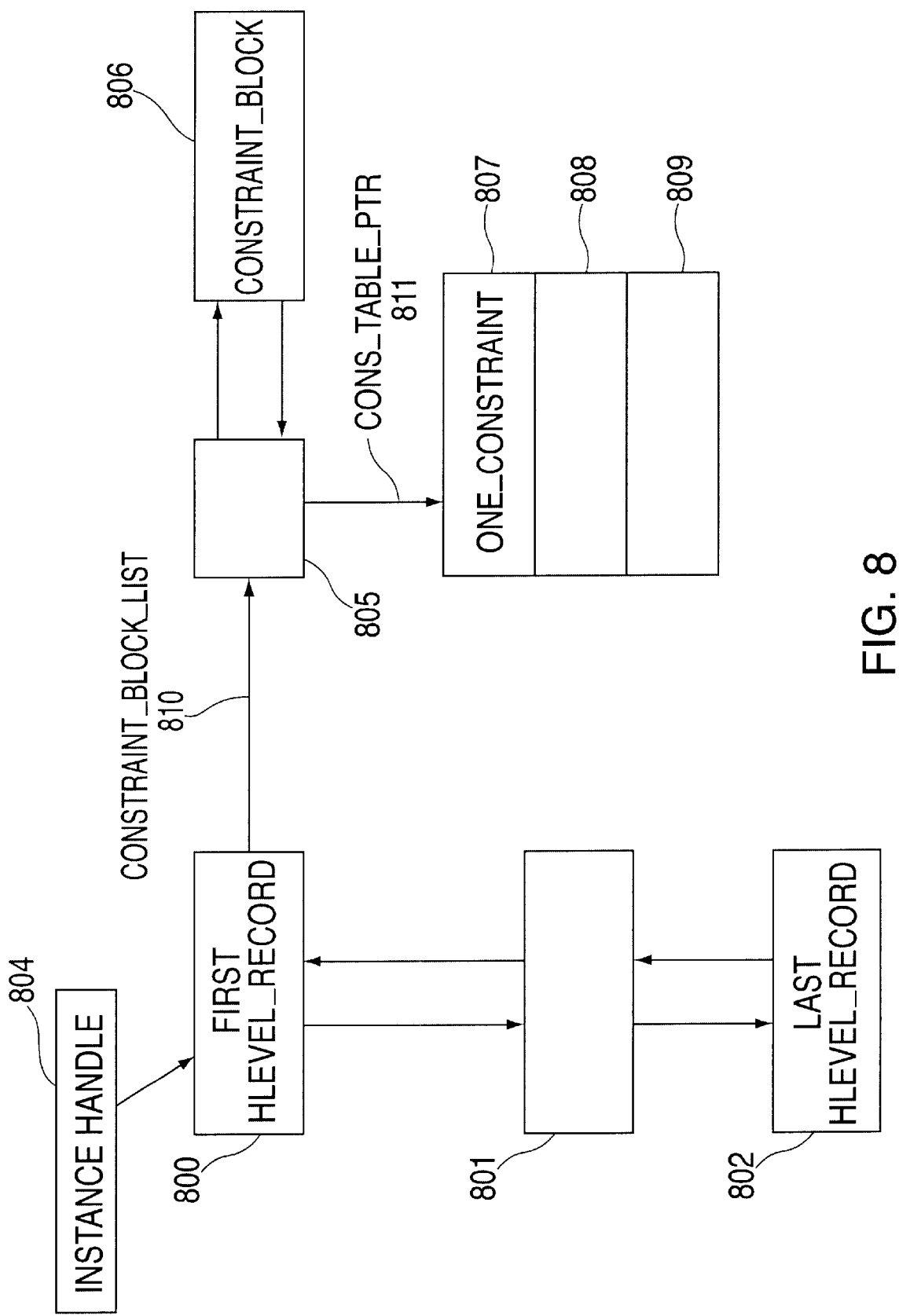
FIG. 8 depicts the general structure of an exemplary hierarchical class instance.

The accompanying printed appendices, that are incorporated in and constitute a part of this specification, illustrate several embodiments of the invention and, together with the description, serve to explain the principles of the invention. These appendices are written in a pseudo-code that is loosely based upon the C and C++ programming languages:

Appendix 1 contains a description of the randomize method for assigning random values to random variables of an instance;

Appendix 2 contains a description of the build_dag function, utilized by the randomize method, which constructs a directed acyclic graph (DAG) of certain of the random variables declared for an instance;

Appendix 3 contains a description of the linearize_dag function, utilized by the randomize method, which linearizes the DAGs representing the random variables declared for an instance;

Appendix 4 describes the include_ON_rvars function, utilized by the randomize method, which ensures that the appropriate random variables are included in the DAG and have a flag set to indicating that they should receive a random value;

Appendix 5 describes the randomize simple_member_vars function, utilized by the randomize method, which assigns a random value to each flagged node of the DAG; and Appendix 6 depicts the constraint_mode method, utilized for controlling constraint blocks in accordance with the present invention.

DETAILED DESCRIPTION OF PREFERRED EMBODIMENTS

Reference will now be made in detail to preferred embodiments of the invention, examples of which are illustrated in the accompanying drawings. Wherever possible, the same reference numbers will be used throughout the drawings to refer to the same or like parts.

1. Overview re Veriloq and Vera

The present invention relates to an HVL known as the Vera Verification System language from Systems Science Inc., Palo Alto, Calif. (which is now part of Synopsys, Inc., Mountain View, Calif., U.S.A.), hereinafter referred to as the "Vera language." A comprehensive presentation of the Vera language, and its capabilities, is presented in the Vera User's Manual which is included in the present patent as a Microfiche Appendix. As part of the verification process described above, a program written in the Vera language models the environment of the DUT by producing the test data or signals to which the DUT is subjected as well as recording or analyzing the DUT's responses. A Vera language model can be used to test any kind of DUT, provided that the appropriate interface is provided. Vera is primarily utilized, at present, with DUTs that are modeled in the Verilog HDL language (hereinafter referred to as the "Verilog language") and are being executed on an event-driven simulator. However, a Vera model could be utilized with a DUT expressed in other languages and executed on other event-driven or cycle-driven simulators. For example, the DUT could be expressed in the VHDL language. The DUT which the Vera language program is testing need not even be a software simulation. For example, the DUT to be tested could be emulated in hardware, or could even be an actual integrated circuit.

The primary usage of the Vera language, that being its usage in conjunction with an event-driven Verilog-modeled DUT, interfaces and synchronizes with a DUT as follows. This general topic of interfacing and synchronization is also discussed in the Microfiche Appendix, Chapter 1.

The Verilog simulator and the Vera simulator are both event-driven simulators that run in a synchronized fashion which may be described as a very efficient form of co-simulation. The Verilog simulator executes a Verilog language model of the hardware device under test (DUT) while the Vera simulator executes a Vera language model of the environment in which the DUT is to be tested. As an environment simulator, the basic functionality of the Vera simulator is to stimulate the DUT by driving certain of its inputs and to monitor the resulting states of the DUT by sampling the values of its nodes.

The Vera simulator implements the Vera language in the following manner. The Vera language is a high-level object-oriented programming language. Programs written in the Vera language are first compiled into lower-level instructions in Vera assembly code. These Vera assembly code instructions are interpreted by the C or C++ routines which comprise the Vera simulator.

The co-simulation is started from the Verilog simulator side since, according to the present embodiment, the Verilog simulator is the main program started by the user and the Vera simulator is a special application which has been linked into Verilog through Verilog's interface for the high-level software-oriented programming languages of C or C++. The Verilog simulator may be any one of a variety of conventional Verilog simulators, such as Verilog-XL produced by Cadence Design Systems of San Jose, Calif. At certain carefully controlled points in time, to be described in more detail below, the Verilog simulation is halted and the Vera simulation is run in a non-preemptive fashion.

Specifically, the Verilog simulator has a programming language interface (PLI) which allows applications written in C or C++ to communicate with the device under test (DUT) as modeled in the hardware-oriented language of Verilog. An example of such an application, that is written in C or C++, is the Vera simulator. The PLI has the following specific features. It permits Verilog language procedures to call specific C or C++ procedures. It permits C or C++ procedures (such as those which implement the Vera simulator) to establish certain nodes of the Verilog model as "callback" nodes. Whenever a node in Verilog, marked as a callback node, changes in value a specific C or C++ procedure or procedures are called. The PLI further permits C or C++ procedures to insert, at a specific time slot in the event queue of the Verilog simulator, a callback to a specific Vera procedure. In addition, the PLI provides functions through which Vera language programs can both examine the value of certain nodes in the Verilog simulation and set the value of certain Verilog nodes. While PLI functions permit Vera to immediately examine the value of certain Verilog nodes, the setting of Verilog nodes becomes a scheduled event in Verilog which is actually performed when Verilog is restarted.

The specifics of the Verilog/Vera co-simulation, and its utilization of the PLI functions described above, are as follows.

The Verilog language module first started, when the user begins the Verilog simulation, is called "vshell." vshell calls the Vera simulator procedure "vmc_init" through the PLI. vmc_init performs the following five major functions: i) it loads the Vera assembly language program to be executed by the Vera simulator, ii) it sets up certain nodes of the Verilog model as callback nodes, iii) it creates a "master" context of level 0, which we shall also refer to as "context(0)," for the execution of the main Vera language program, iv) it places context(0) on "the run queue" of the Vera simulator which holds all Vera language contexts waiting to be run and v) it calls "vera_main," the main routine of the Vera simulator. The nodes which vmc_init establishes as callback nodes in step (ii) are typically: i) the Verilog model's system clock, and ii) those clocks specified by Vera language interface statements.

The Vera interface statement is a programming construct by which certain signals in the Vera model (which we shall refer to as "data" signals) are connected to certain signals in the Verilog model (which we shall also refer to as "data" signals), and the communication of information between the two models is synchronized with a single signal of the Verilog model that is defined as the clock signal for that particular interface. A Vera language program may contain multiple interfaces and each interface may have a different signal selected as its clock. If an interface does not specify a clock, then the Verilog system clock is utilized by default. In addition to specifying a clock, the interface statement specifies the particular edge (positive or negative) of the clock upon which each data signal of the interface is to be driven or observed. In addition, the interface can specify a certain skew time, before the selected edge of the interface's clock, at which each data signal is to be observed by Vera. The interface can also specify each data signal as being driven by Vera a certain skew time after the selected edge of the interface's clock.

The direct call by vmc_init to vera_main, rather than starting the Verilog simulation, is necessary since there may be instructions in the Vera language program that vera_main can execute before any clock events have occurred in the Verilog simulation. vera_main always begins by performing the following two major operations: i) checking the queue of contexts waiting to be executed for any contexts which, in light of the clock edge which has just occurred to cause vera_main to be called, should now be transferred to the run queue, and ii) running, in turn, each context on the run queue.

At this early point in the co-simulation's execution, the wait queue will be empty but the run queue will have the main Vera language context, context(0), created by vmc_init. context(0) will execute until it reaches a Vera construct which requires a clock edge which has not occurred yet. It is significant to note that context(0) may fork off one or more sub-contexts, which we shall refer to as context(1), context(2), . . . Each of these sub-contexts is also put on the run queue and executed until a clock edge, which has not yet occurred, is required. As each context is executed as far as it can be, without a further clock edge occurring, the context is moved from the run queue to the wait queue with a notation as to the clock edge it requires before it can continue execution. When the run queue is finally empty of contexts to execute, vera_main returns control to vmc_init. vmc_init returns control to vshell and vshell starts the main Verilog language module that is modeling the DUT.

The Verilog modules modeling the DUT execute until a change occurs to a clock node which causes the calling of a callback procedure of Vera. The Verilog system clock node preferably has its own first callback procedure, independent of a second callback procedure shared by all other clock nodes as specified in Vera interface statements. This separation into two callback procedures is done in order to improve the speed of callback processing. Each of these callback procedures, however, operates as follows. First, the callback procedure determines whether the clock edge which caused the procedure to be called is of the right type (either positive or negative) for any data signal of any interface statement it serves as clock signal for. If the clock edge is of the right type for any data signal of any interface statement to which the clock is connected as the clock of that interface statement, then the callback procedure inserts into the Verilog event queue, at the time step immediately following the time step in which the callback procedure was called, a PLI call to vera_main which also contains an indication of the Verilog clock signal which changed, and the nature of the transition (positive or negative). The callback procedure then returns control to the Verilog modules simulating the DUT which will continue processing any events at the current time step of the Verilog event queue. Assuming that the callback procedure inserted a PLI call to vera_main, as soon as all events in the event queue at the current Verilog time step are exhausted, the inserted call to vera_main is executed.

When vera_main is called, through a PLI call inserted in the Verilog event queue, the clock and transition it represents is checked against the contexts waiting for a clock transition in the wait queue. As discussed above for vera_main, it will compare those contexts which are waiting to the particular clock transition which produced this call and will transfer to the run queue those contexts which are now satisfied. Each context in the run queue is then executed until all contexts have been executed as far as they can without a new clock edge and are either: i) finished, or ii) back on the wait queue. If a skew has been specified in the interface statement for data signals being used by a context, that skew is accomplished during the running of the contexts as follows. Data signals which are to be observed by Vera a certain skew time before the clock edge are observed through a delay device at the time of the clock edge. Data signals which are to be driven by Vera a certain skew time after the clock edge are driven through a delay device at the time of the clock edge. Once the run queue is empty, control is returned to the Verilog simulation at the point just after the inserted PLI call to vera_main.

While most Verilog/Vera communication is typically synchronized through interface statements as described above, there are two additional forms of synchronization: i) a Vera language specification that the Verilog simulation call the Vera simulation at some particular point in time of the Verilog simulation, and ii) a Vera language specification that the Verilog simulation call the Vera simulation upon a specified asynchronous transition of a specified signal, independent of any other clock signal. Each of these two additional forms of synchronization is handled by an additional callback procedure, in addition to the two callback procedures discussed above. As with the callback procedures discussed above, this division into two additional callback procedures is done in order to increase the speed of callback processing. Both of these two additional forms of Verilog/Vera synchronization are accomplished by having vmc_init perform some additional operations during step (ii) of the five major vmc_init functions described above. With regard to each call to Vera at a Verilog time, vmc_init through the PLI inserts in the event queue of Verilog, at the appropriate point in time, a call to a third callback procedure which is optimized for handling this type of callback situation. This third callback procedure inserts into the Verilog event queue, at the time step immediately following the time step in which the third callback procedure was called, a PLI call to vera_main which also contains an indication of the time step at which Verilog has arrived. The callback procedure then returns control to the Verilog modules simulating the DUT which will continue processing any events at the current time step of the Verilog event queue before the inserted call to vera_main is executed. vera_main will then check the time passed to it against any contexts which are waiting for that time to occur before executing. vera_main will continue executing various contexts until the run queue becomes empty, at which point control is returned to the Verilog simulation at the point just after the inserted PLI call to vera_main. With regard to the asynchronous Vera call, vmc_init through the PLI sets up these asynchronous nodes as calling a fourth callback procedure. This fourth callback procedure investigates whether the transition which has occurred is the one sought for by a particular Vera language statement and if so, inserts into the Verilog event queue, at the time step immediately following the time step in which the fourth callback procedure was called, a PLI call to vera_main which also contains an indication of the node which has changed and the transition type. The callback procedure then returns control to the Verilog modules simulating the DUT which will continue processing any events at the current time step of the Verilog event queue before the inserted call to vera_main is executed. vera_main will then check the asynchronous transition indication passed to it against any contexts which are waiting for that transition to occur before executing. vera_main will continue executing various contexts until the run queue becomes empty, at which point control is returned to the Verilog simulation at the point just after the inserted PLI call to vera_main.

2. Vera Language Programming and Stimulus Generation

Vera is a language which supports a programming style known as Object-Oriented Programming (or OOP). It is a programming language in which classes, and hierarchies of classes, can be defined. A class defines both variables (also known as properties) and methods which operate upon those variables. Instances of a class are pointed to by handles and instances are created by functions known as constructors. These basic principles of OOP are well-known. How these principles operate within the Vera language are discussed in the Microfiche Appendix.

In particular, Chapter 8 introduces OOP in Vera, which needs to be read in conjunction with the other Chapters describing the Vera language. For example, methods in Vera (also referred to as subroutines) are discussed in Section 4.6 of the Microfiche Appendix. In Vera, subroutines are of two types: functions (which return a value) and tasks (which do not return a value). The built-in data types, of which variables can be declared, are covered in Chapter 3 of the Microfiche Appendix. FIG. 1 depicts the basic syntactic structure for a class definition. Note that elements of the definition surrounded by angle-brackets ("<" and ">") specify meta-variables which are to be filled in with particular information of the type described between the angle-brackets. Elements of the definition surrounded by square-brackets ("[" and "]") are optional. Therefore, in FIG. 1, "extends" is only necessary if <class name> is a child class of some <parent class>.

The present invention adds to Vera capabilities which facilitate the generation of random data. These Vera capabilities, and their programming language constructs, are discussed in Chapter 9 of the Microfiche Appendix entitled "Automated Stimulus Generation." Within the class definition framework of FIG. 1, these additional capabilities augment the <variable declarations> and add a new area of the class definition shown as <constraint blocks>. Such random data would typically be used as stimulus for a DUT. The principles of the present invention can be applied, however, in any application where it is useful to have random data which can be constrained to be within certain parameters and/or have certain characteristics. Other programming language constructs and capabilities of the Vera language are used to sample the DUT's responses and to evaluate whether the DUT is functioning correctly. Some of Vera's other capabilities for monitoring and evaluation are discussed in Chapters 4 and 11 of the Microfiche Appendix.

In an analogy to classical signal-processing models, Vera provides a "source" of data (random number generation) and a series of "filters" (constraints) to transform that data into a form which provides adequate testing. These constructs, which collectively provide a facility which we shall also refer to as "constrained random number generation," are focused upon in Section 9.3 of the Microfiche Appendix. In addition to providing for random data generation, Vera also has constructs to permit the "packing" and "unpacking" of data within an object. Such pack and unpack facilities (which are focused upon in Section 9.4 of the Microfiche Appendix) are often useful in testing a DUT with packets that need to be sent and/or received via serial bit streams.

Sources of random numbers are easily produced by simply adding the attribute "rand" or "randc" to a variable declaration of a class definition. This is depicted in FIG. 2. We will also refer to the "rand" or "randc" attributes, collectively, as a "randomness attribute." Variables to which such a randomness attribute has been added shall also be referred to as "random variables." The syntax and detailed meaning of these attributes are discussed in Section 9.3.1 of the Microfiche Appendix. Adding the "rand" or "randc" attribute to a variable declaration permits a class instance to make meaningful use of certain methods for the generation of random values for that variable. These methods, to be discussed below, are: "randomize" and "rand_mode." The invocation of these two methods is shown in FIG. 4. These methods are added to all class definitions, whether they contain a random variable declaration or not, to ensure that these methods perform properly within the various class hierarchies that may be formed.

Randomize is discussed in Section 9.3.2 of the Microfiche Appendix. Consider a handle to a class instance, which we shall refer to as <instance> (and which is also referred to in the Microfiche Appendix as an "object_name"). The method call "<instance>.randomize( )" causes any variables of that instance, with either a rand or randc attribute, to have a randomly generated value assigned.

While the randomness attribute of a random variable is initially active, meaning for example that a randomize method call will assign it a random value, this attribute can be switched either OFF or ON under program control. This switching of the randomness attribute is accomplished with the method "rand_mode" whose meaning and syntax is discussed in detail in Section 9.3.1.2 of the Microfiche Appendix. rand_mode can also be used to determine whether the randomness attribute of a particular random variable is ON or OFF with the REPORT parameter as shown in FIG. 4.

As discussed in Section 9.3.1 of the Microfiche Appendix, the randomness attribute can be added to variables of type: integer, bit, enumerated, and object (which we shall refer to as a "sub-object" or "nested object"). A sub-object is a declaration that another user-defined class (rather than a built-in primitive data type) be instantiated as a variable of a class definition. The randomness attribute can be applied to arrays of type: integer, bit, enumerated or sub-object. If the array is associative (meaning that its size is unspecified), then the range of the array to which the randomness attribute will apply is specified by adding an "assoc_size" expression, as discussed in Microfiche Appendix Sections 9.3.1 and 9.3.2.3. The syntax for declaring a random associative array is depicted in FIG. 3.

Without any specification of constraints, the values that can be assigned to a random variable are simply limited by the range of values permissible for the variable's basic data type.

The values assigned to random variables are further controlled using "constraint blocks" as discussed in Section 9.3.3 of the Microfiche Appendix. Constraint blocks are put in the class definition after the variable declarations and before the methods as shown in FIG. 1. Adding constraint blocks to a class definition permits a class instance to make meaningful use of the "constraint_mode" method (discussed below). This method is added to all class definitions, whether they contain a constraint block definition or not, to ensure that the method perform properly within the various class hierarchies that may be formed. Each constraint block is given a name and is comprised of one or more expressions of type "constraint_expression." The basic syntax for defining a constraint block is shown in FIG. 5. Each constraint_expression limits the values which can be assigned to a random variable. A constraint_expression is always composed of: a left-hand-side (lhs) random variable, a relational operator (or relop) and a right-hand-side (rhs) expression. The syntax for a constraint expression is shown in FIG. 6. A constraint_expression limits the values assignable to its lhs random variable. The rhs expression of a constraint_expression defines a range or ranges of values, where a range is a continuous sequence of integer values bounded by, and including, a minimum and a maximum. The permissible values of the lhs variable are defined as being those values which bear the relation of relop with respect to the range or ranges of values defined by the rhs expression. The permissible relops include many standard operators, which are further defined in Section 3.6 of the Microfiche Appendix, as well as operators "in," "!in" and "dist" of distribution sets which are discussed in Section 9.3.3.1, Microfiche Appendix.

Constraint blocks are initially active, meaning that they will act to constrain the random variables on the lhs of their constraint_expressions. Vera provides (as discussed in Section 9.3.3.3, Microfiche Appendix) for the predefined method "constraint_mode" to activate or deactivate constraint blocks. The syntax for the invocation of constraint_mode is shown in FIG. 7.

Consider once again the handle to a class instance "<instance>." The method call "<instance>.constraint_mode(ON)" activates all of the instance's constraint blocks, while the method call "<instance>.constraint_mode(OFF)" deactivates all of the instance's constraint blocks. A particular constraint block can be activated or deactivated by including, after the ON/OFF parameter, the constraint block's name. Whether a particular constraint block is active or inactive can be determined, under program control, by the method call "<instance>.constraint_mode(REPORT, <constraint_block_name>)," where <constraint_block_name> represents the name of a particular constraint block whose status is to be queried. The REPORT feature of constraint_mode returns a value of either ON or OFF.

The rhs expression of a constraint_expression may include random variables. This introduces two major additional complications: cyclic dependencies between random variables, and a requirement that the non-cyclic assignment of values to certain random variables be done in a particular order. Even if logically consistent, Vera does not allow cyclic dependencies between random variables. Cycles could appear in two main ways: i) trivially where the same random variable appears on both the lhs and rhs of the same constraint_expression, or ii) where two or more constraint_expressions, that are ON simultaneously, define a cyclic dependency. As discussed in Section 9.3.3.6 of the Microfiche Appendix, the randomize method must sort the random variables before randomizing them to ensure that as each a random variable on the rhs of a constraint_expression has been assigned a value before it is utilized to constrain the lhs of the constraint_expression. As discussed below, the correct ordering for the non-cyclic assignment of values to random variables is maintained by a directed acyclic graph (or DAG).

3. Data Structures For Vera Instances

In order to further understand the detailed operation of the methods described above, a discussion of the data structures for Vera instances, upon which such methods operate, is presented in this section.

The following data structures are created as part of each new instance of a class. Certain of these data structures are also depicted in FIGS. 8 and 9.

A chain of records, each called a "HLevel_record" (standing for "hierarchy level record"), are created with one such record being created for each level of the class hierarchy. A listing of the contents of an HLevel_record is shown in FIG. 9. These are HLevel_records 800, 801 and 802 of FIG. 8. The chain of HLevel_records is pointed to by the instance's handles (an instance handle is basically a pointer, which points to an instance, and has certain information about the type of instance it is permitted to point to). An example instance handle 804 is shown. Handle 804 happens to point to the highest level of the instance's hierarchy. Other handles could point to other levels of the same object. The HLevel_record's are connected as a doubly linked list permitting movement between the levels of hierarchy of the instance. The base class is represented by the "first" or "highest level" HLevel_record in the list (such as HLevel_record 800), while the narrowest sub-class is represented by the "last" or "lowest level" HLevel_record (such as HLevel_record 802). The last HLevel_record is the lowest level record since it has the most ancestors from which to inherit variables and methods.

An HLevel_record contains the following (which are also depicted in FIG. 9):

(i) The variables (also known as properties) declared by the Vera language programmer as being part of the particular level of hierarchy represented by that HLevel_record. This includes variables that are handles to an instance of a programmer defined class, which were discussed above as being a sub-object. A sub-object is a declaration that another user-defined class (rather than a built-in primitive data type) be instantiated as a variable of a class definition. Sub-object variables differ from built-in data types in that when an instance incorporating sub-objects as a variable are created, only space for a pointers to the sub-objects are created. The programmer must provide for the creation of the sub-objects and the setting of the pointers to these sub-objects. Typically, the constructor of the instance incorporating sub-objects would be augmented with an appropriate invocation to all the constructors necessary to create all of its nested objects.

(ii) The number of random variables in HLevel_record is stored in a location called "num_rvars." A pointer, called "ptr_to_all_rvar_ptrs," points to an array of pointers. Each pointer in the array of pointers points to a unique random variable of the HLevel_record.

(iii) Each random variable of an HLevel_record has a flag, called "rand_flag," which indicates whether the random attribute of the variable is ON or OFF.

(iv) Additional information is stored for "randc" random variables. Each randc non-array random variable has a pointer to a table, called "rtable," which keeps track of the values which have already been generated for that random variable. Typically, rtable has 1 bit of storage associated with every possible value of the randc variable. As each value of the randc variable is generated, the fact that this value has been produced is "checked off" in rtable to insure that duplicate values are not generated. Since the Vera language currently permits randc variables to be only up to 8 bits in size, the largest rtable need only have 256 1-bit entries.

Larger randc variables could be accommodated with correspondingly larger rtables. If the randc declaration is for an ordinary fixed-size array of randc random variables, an rtable is created for each such array element. If the randc variable is an associative (i.e., variable-sized) array, a flag "rand assoc_array" is set to indicate that an rtable should be created for each element, later, when the number of elements is known.

(v) HLevel_record also contains the following storage locations in order to support constraint blocks. Each constraint block has its status, of being either "ON" or "OFF," stored in a "hidden variable" called "hidden_var." Each HLevel_record also contains a pointer (called "constraint_block_list") to a list of "constraint_block" records, where each constraint_block record represents either i) a constraint block which has been defined for the particular level of the class hierarchy represented by the HLevel_record, or ii) the associative arrays at the level of hierarchy represented by HLevel_record. An example constraint_block_list pointer 810 is shown in FIG. 8 pointing to a list of constraint_blocks 805 and 806.

(vi) HLevel_record contains a pointer, called "DAG," which points to the directed acyclic graph constructed for the instance to represent any dependencies among its random variables. There is only one such DAG per instance, and the DAG is pointed to only by the DAG pointer of the first, or highest level, HLevel_record.

Each "constraint_block" record contains the following fields which are shown in FIG. 10. "cons_block_name" contains the name of the constraint block represented by constraint_block. "hidden_var_ptr" is a pointer to the hidden variable in HLevel_record which stores the constraint block's ON or OFF status. "num_constraints" contains the number of constraint_expressions in the constraint block represented by constraint_block. "cons_table_ptr" is a pointer to an array of "one_constraint" records, where each one_constraint record represents a unique constraint_expression within the constraint block represented by constraint_block. An example cons_table_ptr 811 is shown in FIG. 8 pointing to an array of one_constraint records 807, 808 and 809.

Each "one_constraint" record contains the following fields, which are also shown in FIG. 11. "lhs" is a pointer to the random variable, in an HLevel_record, on the left side of the constraint_expression represented by one_constraint. The random variable pointed to by lhs may be in the HLevel_record with which the one_constraint is directly associated, or in any of its ancestor HLevel_records. "relop" contains the operator which connects the lhs of the constraint_expression to the rhs of the constraint_expression. "num_rhs_vars" contains the number of random variables on the right hand side of the constraint_expression. "rhs_vars" is a pointer to an array of pointers, where each pointer in the array points to a random variable, in an HLevel_record, which is on the rhs of the constraint_expression represented by the one_constraint record. The random variables pointed to by the array of pointers may be in the HLevel_record with which one constraint is directly associated, or in any of its ancestor HLevel_records. "start_addr" contains the address for beginning execution of a Vera assembly language code block which evaluates the value of the rhs of the constraint_expression.

If the class hierarchy level represented by HLevel_record contains associative arrays, then the constraint_block and one_constraint records, as defined above in FIGS. 10 and 11, are set with values as defined, respectively, in FIGS. 12 and 13. The syntax for an associative array declaration is shown in FIG. 3.

There is only one constraint_block record for representing "assoc_size" expressions, per HLevel_record, regardless of whether there are one or more associative arrays are at the particular class hierarchy level represented by HLevel_record (there is no constraint_block record for representing assoc_size if there are zero associative arrays at a particular class hierarchy level). This constraint_block record is merely another record listed in the list of constraint_block records pointed to by the pointer constraint_block_list in HLevel_record. Preferably, this constraint_block is at the beginning of the list. The fields of the constraint_block for representing these associative arrays contain the following. "cons_block_name" contains "assoc_size." "hidden_var" is null since the assoc_size constraints are treated as always being ON. "num_constraints" contains the number of associative arrays in the HLevel_record. "cons_table_ptr" is a pointer to an array of "one_constraint" records, where each one_constraint record represents a unique associative array within the class hierarchy level represented by HLevel_record.

Each "one_constraint" record, when utilized to represent an associative array, contains the following. "lhs" is a pointer to the data storage in the appropriate HLevel_record for maintaining the entire associative array. "relop" contains "ASSOC_SIZE." "num_rhs_vars" contains the number of random variables in the expression on the rhs of "ASSOC_SIZE." "rhs_vars" is a pointer to an array of pointers, where each pointer in the array points to a random variable, in an HLevel_record, which is on the rhs of ASSOC_SIZE. The random variables pointed to by the array of pointers may be in the HLevel_record with which one constraint is directly associated, or in any of its ancestor HLevel_records. "start_addr" contains the address for beginning execution of a Vera assembly language code block which evaluates the value of the expression on the rhs of ASSOC_SIZE.

4. Randomize

The pseudo-code definition for the randomize method is shown in Appendices 1–5. Appendix 1 presents the randomize method itself, while appendices 2–5 present the support functions. The following discussion presents the execution of randomize, beginning with its initial invocation by the Vera language programmer with the construct "<instance>.randomize( )." Discussion of the pseudo-code below is sometimes followed by a specific cite to the Appendix, page and line numbers where it occurs.

The pseudo-code of Appendices 1–6 is loosely based on the C and C++ programming languages. The C and C++ programming languages are described in such texts as "A Book on C," by A. Kelley and I. Pohl, Benjamin Cummings Pub. Co., Third Edition, 1995, ISBN 0-8053-1677-9 and "The C++ Programming Language," by Bjarne Stroustrup, Addison-Wesley Pub. Co., 3rd edition, July 1997, ISBN 0-2018-8954-4, which are herein incorporated by reference. When dealing with a pointer to a structure, call it "some_pointer," a variable within the structure, call it "something_within," is referred to by "some_pointer->something_within." Alternatively, if some_pointer points to an instance, a variable or method within the instance (either of which we shall refer to as something_within) is also referred to by the same notation "some_pointer->something_within." If some_pointer is actually a handle to an instance, a variable or method within the instance is still referred to by the notation "some_pointer->something_within." Note that this notation is different from the notation used by the Vera language, which uses a dot symbol (".") rather than the arrow symbol ("->"). Thus in Vera language programming, if "some_handle" is a handle to some instance, and "something_within" is some variable or method within that instance, then the notation used is "some_handle.something_within."

Note that each method has a particular hierarchy level determined by the class it is a member of and the position of that class within a class hierarchy. Within a randomize method, "this" is understood to be a handle to the current instance to which randomize is being applied, and specifically it is a handle to the instance at a hierarchy level corresponding to the method's hierarchy level (see also Microfiche Appendix, Section 8.7). Each HLevel_record represents a hierarchy level of an instance, with the whole sequence of HLevel_records, from first to last, representing the entire instance.

The initial invocation of randomize, by the Vera language programmer, which begins execution at Appendix 1, page 1, line 1, has the parameter "do_it" set to its default value of "1." The randomize method called by this Vera language invocation is defined to be that of the instance's lowest level HLevel_record, regardless of the level of the HLevel_record pointed to by the handle to which randomize is applied. This is because randomize, at the Vera language level, is a "virtual method," as the term is understood generally in the OOP art and in the Vera language in particular. In effect, a virtual method translates a method call upon a handle to something other than the lowest hierarchy level into a method call upon a handle to the lowest hierarchy level at which a method with the same name exists. Since randomize exists for every class it therefore exists at every hierarchy level and therefore the method at the lowest hierarchy level is called.

Method calls within randomize itself, including those to randomize, are not virtual method calls. For these method calls, the method is called whose hierarchy level corresponds to the HLevel_record pointed to by the handle to which the method is applied. Besides randomize, the only other inherently virtual methods of the Vera language, for the task of stimulus generation, are: boundary, pack, unpack, rand_mode and constraint_mode. All of these stimulus functions are discussed at Chapter 9 (a "Chapter" is also referred to as a "Section" in this patent), Microfiche Appendix.

Randomize's first subroutine call is a method call to pre_randomize at the lowest hierarchy level. Appendix 1, page 2, line 11. The default pre_randomize method is a no-op, except for the fact that it performs a recursive calling of the pre_randomize methods defined at successively higher hierarchy levels, but this default operation can be overridden by the Vera language programmer to do any form of initialization which should be done automatically before random values are assigned.

Randomize then calls the procedure "build_dag" which creates a directed acyclic graph (DAG). Appendix 1, page 2, line 29. Nodes of the DAG represent random variables of the instance, while edges represent the dependencies between random variables due to constraints. The DAG must be rebuilt each time randomize is called since the constraints and random variables which are ON may be changed dynamically under program control. Detailed pseudo-code describing the operation of build_dag is shown in Appendix 2. Note that within "build_dag" the pointer "curr_instance" refers to the current instance (at the default level) to which randomize is being applied. Since curr_instance is a copy of "this," from the calling randomize method, it is a handle to the instance at a hierarchy level corresponding to the calling randomize method's hierarchy level. This is also the case for curr_instance in Appendices 3, 4 and 5.

The "DAG" created by build dag is actually a linked list of DAG node data structures, each such data structure called a "dag_node," with the head of the list of dag_nodes pointed to by the "DAG" pointer of the highest-level HLevel_record.

The structure of a dag_node is shown in FIG. 14. These various structures of dag_node will be explained in greater detail below in the course of presenting the pseudo-code for randomize. "rvar_pointer" points to the data storage, in the appropriate HLevel_record, for maintaining the value of the random variable represented by the dag_node. "do_randomize" is a flag which is set to indicate that the random variable, represented by the dag_node, should be assigned a random value. "relop_start_addr_list" is a pointer to a list of relop/start_addr pairs for each constraint expression which constrains the random variable represented by this dag_node. "set_constraint_field" points to a set_constraint data structure which represents the ranges of valid values from which a value for the random variable, represented by this dag_node, may be selected. The linked list of dag_nodes is kept with the pointers "next_dag_node" and "previous_dag_node." The edges of the DAG are formed by pointers between the dag_nodes, where these pointers are organized as follows. The "depends_on_list" of each dag_node X is a pointer that will be set to point to a linked list if the dag_node X depends on other dag_nodes. Each item of a linked list pointed to by depends_on_list is a data structure called a "depends_on_link." Each depends_on_link (besides having the next link pointer necessary for maintaining a linked list) contains a single pointer for pointing to another dag_node. Thus for each dag_node Y that a particular dag_node X depends on, there will be a depends_on_link, in the depends_on_list of dag_node X, with a pointer to dag_node Y. The higher the "ordering_number" of a dag_node, the greater the number of levels of the DAG (of which the dag_node is a part) which depend on the random variable represented by the dag_node. ordering_number is used, as described below, to achieve a linear ordering of the random variables according to which values are assigned.

the more levels of the DAG which depend upon a random variable, the higher its ordering_number will be.

The DAG of an instance is stored as a linear linked list of dag_nodes with additional depends_on_links, rather than solely as a DAG structure, for a variety of reasons. Firstly, there may be more than one DAG necessary to represent all of the dependencies between the random variables of an instance. As will become apparent from the procedures to follow, keeping all the DAGs on a single list is simpler than keeping track of each DAG separately. Secondly, the DAG or DAGs which represent the dependencies need to be linearized anyway (as discussed below) to provide an order in which to assign random values.

build_dag consists of a main loop (beginning at Appendix 2, page 1, line 9) which iterates over each level of the instance's hierarchy, beginning with its highest level. Within this loop is another loop (beginning at Appendix 2, page 1, line 14) which iterates over each constraint block defined for the particular hierarchy level of the instance. Suitable constraint blocks are then processed, for what they may add to the DAG, by calling "add_constraint_block_to_DAG." Appendix 2, page 1, line 38. A constraint block is suitable if it is either for an associative array, or a constraint block which is ON and which is not overridden by a constraint block with the same name at a lower level in the class hierarchy. Thus constraint blocks which are not ON have no effect on constraining the values taken by random variables. Furthermore, constraint blocks which are ON can constrain random variables declared at their level in the hierarchy, or at any higher level of the hierarchy (they cannot constrain variables declared at a lower in the hierarchy since those variables, from the perspective of the constraint block, have not been declared yet). The effects of a constraint block can be completely eliminated by defining, at a lower level in the hierarchy, another constraint block with the same name.

add_constraint_block_to_DAG, whose definition begins at Appendix 2, page 2, line 6, has a main loop which iterates over every one_constraint of the constraint block passed to it. Each such one_constraint, referred to as "cons," is processed by a call to "add_one_constraint_to_DAG." Appendix 2, page 2, line 19.

add_one_constraint_to_DAG, whose definition begins at Appendix 2, page 2, line 29, first checks to see whether the random variable referred to by the lhs of the one_constraint "cons" is already represented by a node in the DAG. If it is not, then such a DAG node is created. This node is referred to as "lhs_node." If lhs_node represents an associative array, then it represents the entire associative array as a symbolic unit rather than creating nodes for each individual element of the array. The reason for not creating a node for each individual element at this time is the fact that the "assoc_size" expression, which would determine the number of elements, may itself depend upon other random variables which have not been assigned values yet.

add_one_constraint_to_DAG then calls "add_to_DAG_node" to add the relop and start_addr of the one_constraint "cons" to the lhs_node. Appendix 2, page 3, line 13. The relop and start_addr are represented by a single data structure which is put on the list, relop_start_addr_list, of lhs_node by add_to_DAG_node.

Next, add_one_constraint_to_DAG has a loop (beginning at Appendix 2, page 3, line 20) which iterates over each random variable utilized in the rhs of one_constraint "cons." Note that the "*" operation of "*(cons->rhs_vars)" in the pseudo-code is a de-referencing operation which returns, in this case, the array of pointers to each random variable on the rhs of the one_constraint. Each such random variable is referred to as "rhs_rvar." If rhs_rvar is already represented by a node in the DAG, referred to as rhs_node, then checks must be made to determine whether the current one_constraint "cons" will introduce a cycle between lhs_node and rhs_node. As discussed above, no form of cyclic dependency between random variables is permitted in the Vera language. If rhs_rvar is not already represented by a node in the DAG, then there is no need to check for a cyclic dependency. Whether rhs_node was already in the DAG or not, once the cyclic dependency issue has been eliminated, dependency of the lhs_node upon the rhs_node is added to the lhs_node (of type dag_node as discussed above) by giving its depends_on_list (made up of depends_on_links as discussed above) another depends_on_link which points to the rhs_node (also of type dag_node.) This addition of a depends on_link is performed by "left_arg_depends_on_rt_arg" which is called in Appendix 2, page 4, at lines 9 and 17. The definition for left_arg_depends on_rt_arg begins at Appendix 2, page 4, line 28.

The next step of the randomize method is the procedure "linearize_dag" (called at Appendix 1, page 2, line 30) which reorders the linked list of DAG nodes according their dependencies. The list is ordered such that when each random variable is assigned a value, all random variables upon which it depends have already been assigned values. The pseudo-code for linearize_dag is shown in Appendix 3, while its functionality is described as follows.

The DAG nodes are first given ordering_numbers by linearize_dag as follows. As a result of the following numbering procedure, the more levels of the DAG which depend upon a random variable, the higher its ordering_number will be. The first DAG node in the list is assigned the ordering_number 1. Any DAG nodes that it depends upon are located by following its depends_on_links. These DAG nodes are given the ordering_number 2. This tracing and numbering proceeds transitively. Therefore, for example, for each DAG node with ordering_number 2, the DAG nodes it depends on are located and given ordering_number 3. Once this transitive tracing and numbering has been completed, the next DAG node in the list, after the first DAG node, which has not yet been assigned an ordering_number, is located. This DAG node is given ordering_number I and tracing proceeds transitively through all DAG nodes it depends upon, as was done for the first DAG node in the list. If this tracing encounters a DAG node which has already been assigned an ordering number, then if the ordering_number that would be assigned to the DAG node with the current tracing would be greater than the ordering_number already assigned to it, then the already-assigned DAG node is re-assigned the new higher ordering_number. Tracing and renumbering proceeds transitively, from the re-assigned node in a like manner. Alternatively, if the tracing encounters a DAG node with a previously-assigned ordering_number that is greater than the ordering_number which would be re-assigned to it, then the previously assigned ordering_number is kept and transitive tracing stops at that point. The algorithm proceeds with the basic two part cycle of moving forward through the list until it finds a DAG node not already assigned a ordering_number, and then assigning numbers through a transitive tracing, until it reaches the end of the list.

Once this numbering has been completed, linearize_dag then sorts the DAG nodes in order of decreasing ordering_number when proceeding from the front of the list to the end. Since each random variable is guaranteed to have a higher ordering_number than all of the random variables which depend on it, proceeding to assign values to the random variables of the instance's DAG, from the front of the DAG list to the back, ensures that when each random variable has its value assigned, the variables it depends on are already assigned values.

At this point in the execution of randomize, an ordered list of the DAG nodes has been produced for those random variables which: i) appear in a constraint block, and ii) appear in a constraint block which is ON. However, there may be random variables which: i) do not appear in any constraint block, or ii) have their randomness attribute turned OFF. The unconstrained variables need to be inserted in the list produced by linearize_dag in order that all random variables are assigned values. Unconstrained variables can be inserted at any point in the list since they depend upon no other random variables, however it is most efficient to insert them at the beginning of the list. Random variables whose randomness attribute has been turned OFF should not be assigned a value by randomize.

These operations are performed by "include_ON_rvars" of the randomize method. Detailed pseudo-code for include_ON_rvars is included in Appendix 4.

include_ON_rvars begins by iterating (at Appendix 4, page 1, line 8) over all the HLevel_records of the current instance (called "curr_instance"). At each hierarchy level of the instance, all the random variables are looped over. If the random variable is not an array, the function "ensure_in_DAG" is called to ensure that the variable, if its randomize attribute is ON, is both represented by a DAG node and that the DAG node has the value TRUE for a flag indicating that it should be assigned a random value (called the "do_randomize" flag). If the random variable is a non-associative array, then ensure_in_DAG is called for every element of the array. If the random variable is an associative array, then if its rand_flag is ON, ensure_in_DAG simply sets the do_randomize flag for the single DAG node representing the entire array as a symbolic unit. Later, during function "randomize simple_member_vars," when the associative array is evaluated in the proper sequence with respect to the other random variables, the number of nodes indicated by its "assoc_size" expression is created.

The next step of the randomize method is to evaluate randomize_simple_member_vars. randomize_simple member_vars iterates over every DAG node, with each such node being referred to as a "dnode." If a dnode does not symbolically represent an entire associative array, then it is processed by "evaluate_constraints" (Appendix 5, page 2, line 16) and "set_random_value" (Appendix 5, page 2, line 20). evaluate_constraints evaluates the constraints placed upon dnode in order to determine a set of valid ranges of values for dnode. set_random_value randomly selects a value for dnode from one of its ranges.

If dnode does symbolically represent an associative array, then the start_addr information stored on this node is for determining the assoc_size expression. This expression is evaluated to determine the size of the array for randomizing purposes. Appendix 5, page 1, line 24. A node is created in the DAG for each element to be randomized if: i) this node is not already represented in the DAG list (Appendix 5, page 1, lines 37–38), and ii) the randomize attribute of this array element has not been turned OFF (Appendix 5, page 1, lines 39–40). Note that the rand_flag might be OFF at two levels: the flag for the entire array, or a flag for the individual element. The flag for an individual array element, if set, overrides the flag for the entire array. A rand_flag for an associative array element can have three values: OFF, ON or DEFAULT (meaning "use the whole-array flag").

evaluate_constraints (which begins at Appendix 5, page 2, line 27) operates as follows. As stated above, the purpose of evaluate_constraints is to produce a set of valid ranges of values for the DAG node (dnode) passed to it. This set of valid ranges is represented by a "set_constraint" data structure, shown in FIG. 15. A set_constraint is an array of tuples, where each tuple represents a valid range. Each tuple contains the following parts: low_end (representing the low end of range), high_end (of the range), apportion_op (the apportionment operator for weight over the range), weight (for the range applied by apportion_op), sub_ranges (a pointer to a linked list of sub_ranges which the range may be split into) and num_values (which is the number of valid values in this range). Apportionment of weight is indicated by the Vera language operators ":=" or ":/," which are discussed in Section 9.3.3.1, Microfiche Appendix. Apportionment operator ":=" means that the specified weight is given to each value of the range, while operator ":/" means that the specified weight is divided equally among all the values of the range.

If a dnode appears on the lhs of no constraints, evaluate_constraints will give it a single range whose low end is the value of type_min, and whose high end is the value of type_max. The apportionment operator will be ":=" assigning a weight of "1" to every value of the range. This "default" behavior of evaluate_constraints will be apparent from the discussion below. The values of type_min and type_max are defined at Appendix 5, page 2, line 29 to page 3, line 6.

The main loop of evaluate_constraints begins at Appendix 5, page 3, line 25 and ends at Appendix 5, page 6, line 31. This loop iterates over the relop/start_addr pairs attached to dnode and is therefore directed to those DAG nodes which are constrained and have one or more relop/start_addr pairs attached. This loop begins by evaluating the Vera assembly code pointed to by the current value of start_addr with the Vera assembly code interpreter. Appendix 5, page 3, lines 33–34. The result of this interpretation is left on the interpreter's stack and is pointed to by "rhs_constraint_current." If the one_constraint represented by this relop_start_addr_pair contains a conditional which has returned a "void" value then this one_constraint should have no constraining effect and the loop skips to the next relop/start_addr pair. Appendix 5, page 3, line 40. If the assembly code of the start_addr is associated with a relop of type "in," "!in" or "dist," then the result, left on the Vera assembly code interpreter's stack, will be a set_constraint type data structure. If the relop is "in" or "dist," then no further adjustment of this set_constraint is needed. If, however, the relop is "!in," then the ranges of set_constraint need to be inverted. Appendix 5, page 4, line 22. The ranges of the set_constraint originally produced by the Vera assembly code interpreter, for "!in," state those ranges of values which the dnode random variable cannot have. Inversion of this means that the ranges state those values which can be taken by the random variable.

set_constraint current is then set to rhs_constraint_current in order to save this set_constraint data structure for after the completion of this loop. If the relop is "in," "!in" or "dist," then the rest of this loop iteration is a no-op (since other relops are tested for). Since there should only be one relop of type "in," "!in" or "dist," per random variable, per instance, the value of set_constraint_current should not be further changed during this loop over relop/start_addr pairs attached to dnode.

If the relop is "<," "<=," ">" or ">=," then rhs_constraint_current will be a simple number. These constraints can cause an update to the Vera language programmer determined minimum or maximum for the random variable represented by dnode. These relops are handled by the pseudo-code at Appendix 5, page 4, line 30 to page 5, line 13.

If the relop is "==," then dnode is being limited to just a single value. It is therefore logically inconsistent if there are two or more such constraints limiting the same random variable to two or more different values. Appendix 5, page 5, lines 15–32.

A relop of "!=" limits dnode to not be of a particular value and these values are put on a list "ne_val." Appendix 5, page 5, lines 34–40.

relop "=?=" limits dnode to be one of a particular set of numbers, and these numbers are put on the "aeq_val" list. Appendix 5, page 5, line 42 to page 6, line 16.

relop "!?=" limits dnode to not be one of a particular set of numbers, and these numbers are put on the "ane_val" list. Appendix 5, page 6, lines 18–29.

While looping over the relop/start_addr pairs for a dnode, a great many consistency checks are made. In general, these are done after evaluating each new relop/start_addr pair, in order to notify the user as soon as a problem has been detected.

One group of consistency checks deals with rhs values that are invalid for the type of constraint. For example, a rhs value that contained "x" or "z" bits would not be valid if the relop were "<," "<=," ">," ">=," "==" or "!=," since those relational operators require numbers to be meaningful constraints. Similarly, if the lhs is a bit variable, which cannot be negative, it would be an error if the relop were "<" or "<=" and the rhs were a value that would constrain the lhs to be negative. It would also be an error, for a lhs bit variable, if the relop (of type ">" or ">=") and the rhs value would constrain the lhs value to be a value larger than that type of variable could hold (e.g., lhs constrained to be ">9," but lhs a 3-bit variable).

Another group of consistency checks deals with cross-checking between constraints. For example, a constraint with the ">" operator is checked against "<," "<=," and "==" constraints. More specifically, for example, the constraints "lhs>6" and "lhs<4" constraints would conflict with each other. Another specific example of conflict would be between the constraints "lhs>6" and "lhs==3". Similarly, a constraint with the "==" operator is checked against constraints with the operators "<," "<=," ">," ">=." In addition, the "==" operator is checked against any previous constraint with the operator "==, " "!=," "=?=, " and "!?=." Some specific examples of conflicts which could arise between constraints with these operators are as follows: lhs==4 conflicts with lhs==6; lhs==4 conflicts with lhs !=4, and lhs==3'b001" conflicts with "lhs=?=3'b1xx." In a similar fashion, a constraint with the "=?=" operator is checked against other constraints with the following operators in order to detect possible conflicts: "==," "!=," "!?=" and "=?=."

Within a constraint with the operator "in", "!in", or "dist," there are consistency checks to ensure that the low value of a rhs range is less than or equal to the high value of that range, and that the weight is non-negative. A final check is made to see if the removal of disallowed values by range-splitting results in a situation where no allowed values at all remain in the set_constraint.

Once the loop over all relop/start_addr pairs has finished for dnode, a final determination of the set_constraint for this random variable must be made, based upon the various variables that were set in the course of the loop's iterations.

If no set_constraint was created in the loop ("set_constraint_current==NULL" at Appendix 5, page 6, line 43), then a set_constraint structure is created at this point, utilizing the values, set by the loop, for user_min and user_max. In addition, the values of type_min and type_max may influence the range determined. If user_min was not specified or user_min <type_min, then type_min is used, else user_min is used. If user_max was not specified or user_max>type_max, type_max is used, else user_max is used. If a set_constraint has been created by the loop, then (Appendix 5, page 7, lines 10–11) this pre-existing set_constraint is adjusted by the values of type_min, type_max, user_min and user_max.

Before testing for five additional possible adjustments to the set_constraint, an initial estimate of the number of valid values in each range of the set constraint is determined. Appendix 5, page 7, lines 1–18.

The first additional set constraint adjustment depends upon whether eq_val has been set by the loop. Appendix 5, page 7, lines 21–31.

The second possible set constraint adjustment depends upon whether dnode represents an enumerated type random variable. If it does, the appropriate "splits" of the ranges are performed. Appendix 5, page 7, line 34 to page 9, line 10. A single range "split" is simply a division of a single range into two sub_ranges representing a gap, of invalid values, which existed in the previous single range representation. A "sub_range" is a data structure which has all the same fields as listed for a single range of a set_constraint as shown in FIG. 15, except that a sub_range does not include a pointer called "sub_ranges." The "sub_ranges" field of a set_constraint's range is a pointer to a linked list of such sub_range data structures.

The third, fourth and fifth possible adjustments to set_constraint_current are possible additional range splittings based upon, respectively, whether ne_val, ane_val or aeq_val have been set with one or more values. Appendix 5, page 9, line 13 to page 10, line 21.

Once the range splittings have all been recorded, as a linked list of sub_range data structures for each range of set_constraint_current, the ranges of set_constraint_current are copied to a new_set_constraint data structure. This is handled, generally, by the pseudo-code at Appendix 5, page 10, line 24 to page 13, line 7. If a range to be copied has sub_ranges: i) the information of each sub_range is copied to a new range of new_set_constraint; and ii) the weight of the range of set_constraint_current is distributed appropriately to the new corresponding ranges of new_set_constraint. If a range to be copied has no linked list of sub_ranges, then the range is simply copied to a new range of new_set_constraint.

evaluate_constraints returns with dnode being set to have its set_constraint_field point to the permissible ranges of values. Appendix 5, page 13, line 7.

Following the application of evaluate_constraints to dnode, randomize_simple_member_vars applies set_random_value to dnode, whose definition begins at Appendix 5, page 13, line 14.

If dnode has been limited to a single value by its constraint_expressions, then it's an easy matter for set_random_value to pick that single value for dnode. Appendix 5, page 13, lines 17–23.

Otherwise, the selection of a random value is a two step process.

First, a range of dnode is randomly selected by the function "select_range." select range is called at Appendix 5, page 13, line 27, and it is defined beginning at Appendix 5, page 15, line 21.

Secondly, a value is randomly chosen within the selected range. This is handled generally by the pseudo-code at Appendix 5, page 13, line 29 to page 15, line 15.

If the set_constraint for dnode has only one range, then select_range has the easy task of just selecting that single range. Appendix 5, page 15, lines 24–27. Otherwise, select_range selects a range in a process that is random, but which is also influenced by the apportioned weight to each range. The loop of select_range, which iterates over each range of dnode's set_constraint, calculates an array of subtotals, where there is one subtotal for each range. This loop is defined at Appendix 5, page 15, line 29 to page 16, line 4. The difference in size between the subtotal for a range and the subtotal for the previous range determines the size of a "target" which must be "hit" for that range to be the range selected. If the range's apportionment operation is ":/", then the size of a range's target is determined from its weight, which was calculated to preserve its weight relative to the weights of the other ranges. If the apportionment operator is ":=", then the target size of a range is determined from both the weight for each value in the range (which is still calculated to preserve its weight relative to the weights of the other ranges) and the number of values in the range.

select_range returns the value of the index, in the set_constraint attached to dnode, for the range selected. Appendix 5, page 16, line 17.

Returning to a discussion of set_random_value, at the point following the call to select_range, it picks a value at random, within the selected range, as follows. First, the number of individual values within the range (called "range_magnitude") is determined by subtracting the lowest value of the range from the highest value of the range and adding one. Appendix 5, page 13, line 38. The following loop then happens only once, provided that dnode is not a randc random variable. Some random value (called "starter_rand_val") is generated. Appendix 5, page 14, lines 7–8. starter_rand_val can be any size, as long as it is at least as big as range_magnitude. starter_rand_val is then reduced to a random value selected from the range zero to range_magnitude minus one by dividing starter_rand_val modulo the range_magnitude. Appendix 5, page 14, lines 13–14. The result of this modulo divide is then added to the lowest value of the range in order to produce a random selection from within the range. Appendix 5, page 14, lines 13–14.

The "while" loop of set_random_value (whose definition begins at Appendix 5, page 13, line 42) may only iterate if a random value is to be generated for a randc variable. If the random value generated for actual_rand_val has already been generated for the randc variable, as determined by checking its rtable, then this "while" loop performs another iteration allowing for the generation of another random value. This handling of a randc variable is performed generally at Appendix 5, page 14, line 21 to page 15, line 6. If the random value generated for actual_rand_val has already been generated for this randc variable, but every possible value has already been generated for this randc variable, then we are about to begin a new "cycle" of this random variable and actual_rand_val is selected. Also, if beginning a new cycle, the rtable must be completely reset, except for having the just generated value of actual_rand_val being checked off. Finally, if the value of actual_rand_val has not already been generated in this cycle for the randc variable, then it is used for setting dnode.

5. Constraint Mode

The pseudo-code definition for the constraint_mode method, as discussed above in Section 2 of this patent and depicted in FIG. 7, is presented in Appendix 6.

The initial invocation of constraint_mode, at the Vera language level, which begins execution at Appendix 6, page 1, line 1, has the parameter "flag" set to either REPORT, ON or OFF and has the parameter constraint_block_name set to either the name of a specified constraint block or NULL if none is specified. The constraint_mode method called by this Vera language invocation is defined to be that of the instance's lowest level HLevel_record, regardless of the level of the HLevel_record pointed to by the handle to which constraint_mode is applied. This is because constraint_mode, at the Vera language level, is a virtual method, as discussed above.

If the flag is of value REPORT, then the constraint_block must be specified or an error is generated. Assuming a constraint_block name is specified, then constraint_mode performs a loop through all the HLevel_records of the instance's hierarchy, beginning at the lowest level. Within this loop is another loop which iterates over each constraint block defined for the particular hierarchy level of the instance. As soon as a constraint_block is encountered with a cons_block_name that matches constraint_block_name, it's hidden_var value is returned as the value of constraint_mode. Note that if two constraint_blocks have the same cons_block_name, at different hierarchy levels of the same instance, then the hidden_var value of the lower-level constraint_block is returned as the reported value of constraint_mode.

If the flag is of value OFF or ON, then constraint_mode performs a loop through all the HLevel_records of the instance's hierarchy, beginning at the lowest level. Within this loop is another loop which iterates over each constraint block defined for the particular hierarchy level of the instance. For every constraint_block encountered in an instance with a cons_block_name that matches constraint_block_name, it's hidden_var value is set to the value of flag. Alternatively, if no constraint_block_name is specified, then the hidden_var of every constraint_block, other than those which represent associative array sizes, is set to the value of flag.

6. Hardware Environment

Figure 16:
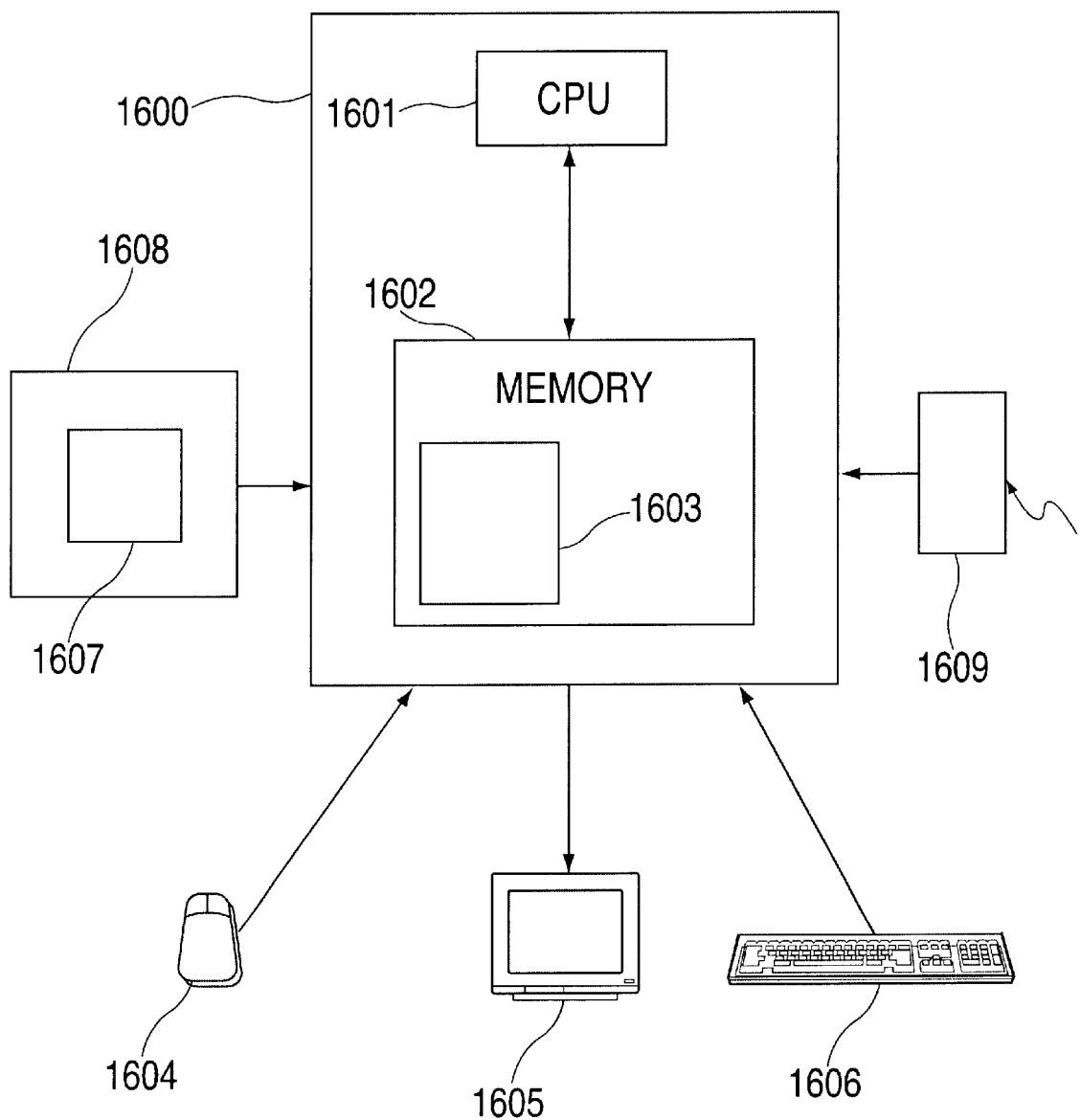
FIG. 16 shows a computing hardware environment within which to operate the present invention.

Typically, the timing analysis architecture of the present invention is executed within the computing environment (or data processing system) such as that of FIG. 16. FIG. 16 depicts a workstation computer 1600 comprising a Central Processing Unit (CPU) 1601 (or other appropriate processor or processors) and a memory 1602. Memory 1602 has a portion of its memory in which is stored the software tools and data of the present invention. While memory 1603 is depicted as a single region, those of ordinary skill in the art will appreciate that, in fact, such software may be distributed over several memory regions or several computers. Furthermore, depending upon the computer's memory organization (such as virtual memory), memory 1602 may comprise several types of memory (including cache, random access memory, hard disk and networked file server). Computer 1600 is typically equipped with a display monitor 1605, a mouse pointing device 1604 and a keyboard 1606 to provide interactivity between the software of the present invention and the chip designer. Computer 1600 also includes a way of reading computer readable instructions from a computer readable medium 1607, via a medium reader 1608, into the memory 1602. Computer 1600 also includes a way of reading computer readable instructions via the Internet (or other network) through network interface 1609.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as fall within the spirit and scope of the appended claims and equivalents.

What is claimed is:

1. A method for generating values, comprising:

traversing a hierarchical organization of data structures, comprising at least a first data structure at a first hierarchical level, a second data structure at a second hierarchical level lower than the first hierarchical level and a third data structure at a third hierarchical level lower than the second hierarchical level; and allocating a first value generator in accordance with a first value generator specification of the first data structure;

applying a third constraint within a third constraint block with a third constraint block identifier, of the third data structure, to the first value generator of the first data structure if the third constraint is denoted as constraining the first value generator; and identifying as not applicable to the first value generator a second constraint within a second contraint block with a second constraint block identifier, of the second data structure, if the second constraint block identifier is determined to satisfy a predetermined relationship with respect to the third constraint block identifier.

2. The method of claim 1, wherein the predetermined relationship is equality between the second constraint block identifier and the third constraint block identifier.

3. A method for generating values, comprising:
   traversing a hierarchical organization of data structures, comprising at least a first data structure at a first hierarchical level and a second data structure at a second hierarchical level lower than the first hierarchical level; and
   allocating a first value generator in accordance with a first value generator specification of the first data structure;
   applying a second constraint within a second constraint block with a second constraint block identifier, of the second data structure, to the first value generator of the first data structure if the second constraint is denoted as constraining the first value generator; and
   identifying as not applicable to the first value generator a first constraint within a first contraint block with a first constraint block identifier, of the first data structure, if the first constraint block identifier is determined to satisfy a predetermined relationship with respect to the second constraint block identifier.

4. The method of claim 3, wherein the predetermined relationship is equality between the first constraint block identifier and the second constraint block identifier.

5. A data processing system for generating values, comprising:
   a circuit configured to traverse a hierarchical organization of data structures, comprising at least a first data structure at a first hierarchical level, a second data structure at a second hierarchical level lower than the first hierarchical level and a third data structure at a third hierarchical level lower than the second hierarchical level; and
   a circuit configured to allocate a first value generator in accordance with a first value generator specification of the first data structure;
   a circuit configured to apply a third constraint within a third constraint block with a third constraint block identifier, of the third data structure, to the first value generator of the first data structure if the third constraint is denoted as constraining the first value generator; and
   a circuit configured to identify as not applicable to the first value generator a second constraint within a second constraint block with a second constraint block identifier, of the second data structure, if the second constraint block identifier is determined to satisfy a predetermined relationship with respect to the third constraint block identifier.

6. A data processing system for generating values, comprising:
   a circuit configured to traverse a hierarchical organization of data structures, comprising at least a first data structure at a first hierarchical level and a second data structure at a second hierarchical level lower than the first hierarchical level; and
   a circuit configured to allocate a first value generator in accordance with a first value generator specification of the first data structure;
   a circuit configured to apply a second constraint within a second constraint block with a second constraint block identifier, of the second data structure, to the first value generator of the first data structure if the second constraint is denoted as constraining the first value generator; and
   a circuit configured to identify as not applicable to the first value generator a first constraint within a first constraint block with a first constraint block identifier, of the first data structure, if the first constraint block identifier is determined to satisfy a predetermined relationship with respect to the second constraint block identifier.

7. A computer program product comprising:
   a computer usable medium having computer readable code embodied therein for causing generation of values, the computer program product including:
      computer readable program code devices configured to cause a computer to effect traversing a hierarchical organization of data structures, comprising at least a first data structure at a first hierarchical level, a second data structure at a second hierarchical level lower than the first hierarchical level and a third data structure at a third hierarchical level lower than the second hierarchical level;
      computer readable program code devices configured to cause a computer to effect allocating a first value generator in accordance with a first value generator specification of the first data structure;
      computer readable program code devices configured to cause a computer to effect applying a third constraint within a third constraint block with a third constraint block identifier, of the third data structure, to the first value generator of the first data structure if the third constraint is denoted as constraining the first value generator; and
      computer readable program code devices configured to cause a computer to effect identifying as not applicable to the first value generator a second constraint within a second constraint block with a second constraint block identifier, of the second data structure, if the second constraint block identifier is determined to satisfy a predetermined relationship with respect to the third constraint block identifier.

8. A computer program product comprising:
   a computer usable medium having computer readable code embodied therein for causing generation of values, the computer program product including:
      computer readable program code devices configured to cause a computer to effect traversing a hierarchical organization of data structures, comprising at least a first data structure at a first hierarchical level and a second data structure at a second hierarchical level lower than the first hierarchical level;
      computer readable program code devices configured to cause a computer to effect allocating a first value generator in accordance with a first value generator specification of the first data structure;
      computer readable program code devices configured to cause a computer to effect applying a second constraint within a second constraint block with a second constraint block identifier, of the second data structure, to the first value generator of the first data structure if the second constraint is denoted as constraining the first value generator; and
      computer readable program code devices configured to cause a computer to effect identifying as not applicable to the first value generator a first constraint within a first constraint block with a first constraint block identifier, of the first data structure, if the first constraint block identifier is determined to satisfy a predetermined relationship with respect to the second constraint block identifier.

9. An electronic data signal representing sequences of instructions which, when executed by a data processing system, cause generation of values by performing the steps of:

traversing a hierarchical organization of data structures, comprising at least a first data structure at a first hierarchical level, a second data structure at a second hierarchical level lower than the first hierarchical level and a third data structure at a third hierarchical level lower than the second hierarchical level;

allocating a first value generator in accordance with a first value generator specification of the first data structure;

applying a third constraint within a third constraint block with a third constraint block identifier, of the third data structure, to the first value generator of the first data structure if the third constraint is denoted as constraining the first value generator; and identifying as not applicable to the first value generator a second constraint within a second constraint block with a second constraint block identifier, of the second data structure, if the second constraint block identifier is determined to satisfy a predetermined relationship with respect to the third constraint block identifier.

10. An electronic data signal representing sequences of instructions which, when executed by a data processing system, cause generation of values by performing the steps of:

traversing a hierarchical organization of data structures, comprising at least a first data structure at a first hierarchical level and a second data structure at a second hierarchical level lower than the first hierarchical level;

allocating a first value generator in accordance with a first value generator specification of the first data structure;

applying a second constraint within a second constraint block with a second constraint block identifier, of the second data structure, to the first value generator of the first data structure if the second constraint is denoted as constraining the first value generator; and identifying as not applicable to the first value generator a first constraint within a first constraint block with a first constraint block identifier, of the first data structure, if the first constraint block identifier is determined to satisfy a predetermined relationship with respect to the second constraint block identifier.

* * * * *